United States Patent [19]

Richter et al.

[11] Patent Number: 4,921,775
[45] Date of Patent: May 1, 1990

[54] ELEMENTS HAVING LAYERS CONTAINING MIXTURES WHICH CAN BE CROSSLINKED BY PHOTOPOLYMERIZATION

[75] Inventors: Peter Richter, Frankenthal; Gerhard Hoffmann, Otterstadt; Klaus Bronstert, Carlsberg; Wolfgang F. Mueller, Neustadt; Karl Gerberding, Wachenheim, all of Fed. Rep. of Germany

[73] Assignee: BASF Aktiengesellschaft, Ludwigshafen, Fed. Rep. of Germany

[21] Appl. No.: 249,339

[22] Filed: Sep. 26, 1988

Related U.S. Application Data

[62] Division of Ser. No. 5,699, Jan. 22, 1987, abandoned.

[30] Foreign Application Priority Data

Jan. 22, 1986 [DE] Fed. Rep. of Germany .... 3601802.3

[51] Int. Cl.$^5$ ................................................ G03C 1/68
[52] U.S. Cl. ..................................... 430/281; 430/905; 522/121
[58] Field of Search ............... 430/271, 281, 905, 970; 522/121, 299, 305

[56] References Cited

U.S. PATENT DOCUMENTS 4,104,330 8/1978 Danzig et al. .
4,162,919 7/1979 Richter et al. .
4,320,188 3/1982 Heinz et al. .
4,423,135 12/1983 Chen et al. .

FOREIGN PATENT DOCUMENTS 3537770.4 4/1987 Fed. Rep. of Germany .
3537771.2 4/1987 Fed. Rep. of Germany .
3537772.0 4/1987 Fed. Rep. of Germany .

Primary Examiner—Jack P. Brammer
Attorney, Agent, or Firm—Keil & Weinkauf

[57] ABSTRACT

Mixtures which can be crosslinked by photopolymerization and are based on binders, photopolymerizable monomers which are compatible with these, photoinitiators and thermal polymerization inhibitors contain, as the binder, polymers of the formula I

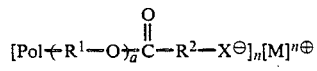

where
Pol is a radical of a block copolymer prepared by sequential anionic polymerization of conjugated dienes and vinyl aromatics,
$R^1$ is a vicinal alkanediyl group,
$R^2$ is a divalent hydrocarbon group of 2 to 20 carbon atoms,
$X^-$ is an acid anion,
M is a metal cation, a metal cation complex or cation of an amine, and
a and n are each an integer from 1 to 10.

4 Claims, No Drawings

ELEMENTS HAVING LAYERS CONTAINING MIXTURES WHICH CAN BE CROSSLINKED BY PHOTOPOLYMERIZATION

This is a division of application Ser. No. 005,699, filed Jan. 22, 1987, now abandoned.

The present invention relates to mixtures which can be crosslinked by photopolymerization, possess improved processing properties and are based on binders, photopolymerizable monomers which are compatible with these, photoinitiators and thermal polymerization inhibitors, the said mixtures containing, as binders, polymers of the formula I

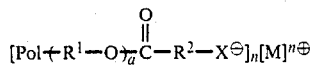

wherein

Pol is a radical of a block copolymer prepared by sequential anionic polymerization of conjugated dienes and vinyl aromatics, $R^1$ is a vicinal alkanediyl group, $R^2$ is a divalent hydrocarbon group of 2 to 20 carbon atoms, $X^\ominus$ is an acid anion, M is a metal cation, a metal cation complex or cation of an amine, and a and n are each an integer from 1 to 10.

The present invention furthermore relates to the use of such mixtures for the production of printing plates, relief plates and photocrosslinkable films, photocurable adhesives, sealing materials and surface coatings, and elastomeric printing forms, relief forms and photocrosslinked films having improved performance characteristics.

The present invention also relates to non-creeping printing plates, relief plates and photocrosslinkable films, photocurable adhesives, sealing materials and surface coatings, and elastomeric printing forms, relief forms and photocrosslinked films which are produced using the novel mixtures.

Mixtures which can be crosslinked by photopolymerization and contain not only monomers, photoinitiators and thermal polymerization inhibitors but also block copolymers corresponding to the moiety Pol of I are disclosed in German Laid-Open Application DOS 2,456,439. However, solid low viscosity mixtures of this type tend to creep in the uncrosslinked state, and printing forms based on these mixtures possess unsatisfactory resilience. Solid mixtures which have a fairly high viscosity and form the basis for the production of printing forms possessing good resilience are, however, poorly soluble in developers and also difficult to process.

Such mixtures are therefore not very suitable for use in the printing form, relief form, film, adhesive, sealing material or surface coating sectors.

It is an object of the present invention to provide novel mixtures which can be crosslinked by photopolymerization, are useful for the production of printing plates, relief plates and photocrosslinkable films as well as photocurable adhesives, sealing materials and surface coatings, have very little tendency to creep and are easy to process.

It is a further object of the present invention to provide mixtures which are suitable for the production of elastomeric printing forms, relief forms and photocrosslinked films.

It is also an object of the present invention to provide novel non-creeping printing plates, relief plates and photocrosslinkable films, photocurable adhesives, sealing materials and surface coatings, and elastomeric printing forms, relief forms and photocrosslinked films.

We have found that these objects are achieved by non-creeping mixtures which can be crosslinked by photopolymerization and are based on binders, photopolymerizable monomers which are compatible with these, photoinitiators and thermal polymerization inhibitors, the said mixtures containing, as binders, the polymers I defined at the outset.

We have furthermore found that such mixtures are very useful for the production of non-creeping printing plates, relief plates and photocrosslinkable films, photocurable adhesives, sealing materials and surface coatings, and elastomeric printing forms, relief forms and photocrosslinked films.

We have also found non-creeping printing plates, relief plates and photocrosslinkable films, photocurable adhesives, sealing materials and surface coatings, and elastomeric printing forms, relief forms and photocrosslinked films, which are produced using the novel mixtures.

Polymers I in which $X^\ominus$ is carboxylate, M is Li and n is 1 are disclosed in German Laid-Open Application DOS 2,723,905. They are prepared by (a) sequential anionic polymerization of vinyl aromatics and of conjugated dienes with lithiumalkyls as initiators, (b) reaction of the living carbanions at the chain ends with alkylene oxides to form polymeric lithium alcoholates, and (c) partial esterification of these alcoholates with dicarboxylic anhydrides. German Patent Application P 35 25 798.9 describes appropriate polymers I in which $X^\ominus$ is sulfonate, as well as polymers I in which M is metal cation or metal cation complex and n is from 2 to 10, and their preparation.

Suitable moieties Pol are block copolymer radicals of the formula II

where m is an integer from 1 to 4, A is a homopolymer block of vinyl aromatics or a copolymer block of vinyl aromatics and conjugated dienes, and B is a homopolymer or copolymer block of conjugated dienes or a copolymer block of conjugated dienes and vinyl aromatics.

Advantageous block copolymer radicals II are those in which m is 1 and which contain from 60 to 97, preferably from 70 to 95 and in particular from 75 to 90, % by weight, based on A+B, of blocks B.

Blocks A having a glass transition temperature Tg of more than 20° C. are advantageous. These blocks may in general have a molecular weight of from 1,500 to 150,000, preferably from 5,000 to 100,000, in particular from 5,000 to 50,000. They may contain minor amounts of conjugated dienes as copolymerized units.

Blocks B having a glass transition temperature Tg below 20° C., preferably below 0° C., in particular below −15° C., are advantageous. These blocks can in general have a molecular weight of from 1,000 to 200,000 or preferably from 15,000 to 150,000, in particular from 20,000 to 100,000. They may contain minor amounts of vinyl aromatics as copolymerized units, and some or all of their olefinic double bonds may be hydrogenated.

Examples of suitable conjugated dienes are butadiene, isoprene, pentane-1,3-diene, 2,3-dimethylbutadiene and hexane-2,4-diene, butadiene and isoprene being preferred.

Examples of suitable vinyl aromatics are styrene, α-methylstyrene, p-methylstyrene, p-tert-butylstyrene and 1-vinylnaphthalene, styrene being preferred.

Examples of advantageous vicinal alkanediyl groups $R^1$ are ethylene, prop-1,2-ylene, phenylethylene, but-1,2-ylene, but-2,3-ylene, cyclopent-1,2-ylene, cyclohex-1,2-ylene and 3-hydroxyprop-1,2-ylene, of which the first three are preferred. These groups are derived from the corresponding epoxides. They may be bonded via block A or block B, but are advantageously bonded via block B. It is also advantageous if a is an integer from 1 to 5, in particular from 1 to 3.

Examples of suitable divalent hydrocarbon groups $R^2$ of 2 to 20 carbon atoms are alkenediyl, alkenediyl, alkadienediyl, cycloalkylene, cycloalkenylene and arylene, ethylene, trimethylene, propene-2,3-diyl, buta-1,3-diene-2,3-diyl, cyclohex-1,2-ylene, cyclohex-3-en-1,6-ylene, cyclopent-1,2-ylene, o-phenylene and naphthalene-1,8-diyl being particularly advantageous.

Examples of suitable groups $X^\ominus$ are carboxylate, phosphonate and sulfonate, carboxylate and sulfonate being advantageous and the former particularly advantageous.

Suitable metal cations M are cations of the alkali metals and alkaline earth metals, and the metals of the lanthanide series and of subgroups I to VIII and main groups III to V of the periodic table of elements. $Li^\oplus$, $Zn^{2\oplus}$ and $Al^{3\oplus}$ are particularly advantageous, n in I being 1, 2 or 3 in these cases.

Examples of suitable metal cation complexes M are $TiO^{2\oplus}$, $VO_2^\oplus$ and cation complexes of the formula III

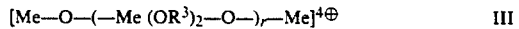

where Me is $Al^{3\oplus}$ or $Cr^{3\oplus}$, r is 0 or an integer from 1 to 20, preferably 0 or from 1 to 10, and $R^3$ is hydrogen or alkyl of 1 to 4 carbon atoms, complexes III in which Me is $Al^{3+}$, r is from 2 to 5 and $R^3$ is methyl being advantageous.

Examples of suitable cations M of amines are those of the formula IV or V

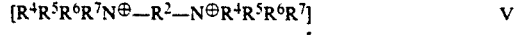

where $R^2$ has the meanings given for formula I and $R^4$, $R^5$, $R^6$ and $R^7$ are hydrogen, branched or straight-chain alkyl, cycloalkyl, unsubstituted or substituted aryl or arylalkyl, e.g. ammonium, dimethylammonium, trimethylammonium, ethylammonium, diethylammonium, triethylammonium, tetraethylammonium, methylethylammonium, di-n-butylammonium, dimethyl-di-n-butylammonium, cyclohexylammonium, dicyclohexylammonium, cyclohexyltrimethylammonium, trimethyloctylammonium, trimethylundecylammonium, tert-butylammonium, neopentylammonium, phenyldimethyl-p-tolyl-dimethylammonium, p-methoxyphenyl-diethylammonium, benzylammonium, dibenzylammonium, 2-phenyl-ethylammonium, dimethyl-bis-(2-phenylethyl)-ammonium, ethylenediammonium, propylenediammonium, N,N,N',N'-tetramethylethylenediammonium, N,N'-diethyl-o-phenylenediammonium, N,N,N',N'-tetra-n-butyl-cyclohex-1,4-ylenediammonium or N,N,N',N'-tetramethyl-[methylene-bis(cyclohex-1,4-ylene)]-diammonium ions. Ammonium ions of aliphatic heterocycles are also suitable, for example the ammonium ions of pyrrolidine, piperidine, imidazolidine, piperazine, isoindoline, quinuclidine or morpholine. The ammonium ions of ethylenediamine and of N,N,N',N'-tetramethylethylenediamine are advantageous.

Liquid polymers I which can be particularly advantageously used according to the invention have molecular weights of from 2,000 to 20,000, in particular from 4,000 to 15,000 (determined by gel permeation chromatography).

Solid polymers I which can be particularly advantageously used according to the invention have molecular weights of from 20,000 to 100,000, preferably from 40,000 to 90,000, in particular from 50,000 to 85,000. Advantageously, they have a viscosity number of from 70 to 300, preferably from 80 to 250, in particular from 110 to 200, ml/g. It is also advantageous if they possess a deformation hardness of from 2,000 to 30,000, preferably from 2,500 to 25,000, in particular from 2,700 to 10,000 (determined according to DIN 53,514), a deformation resilience of from 25 to 65, preferably from 30 to 60, in particular from 30 to 57 (determined according to DIN 53,514) and a Shore A hardness of from 10 to 80, preferably from 15 to 70, in particular from 15 to 65 (determined according to DIN 53,505).

The polymers I used according to the invention are preferably employed in an amount of from 40 to 99, advantageously from 60 to 97, in particular from 70 to 96, % by weight, based on a novel mixture of binder, monomer, initiator and inhibitor.

Suitable compatible photopolymerizable monomers should preferably have a boiling point higher than 100° C. Examples of useful monomers are the esters of acrylic acid and/or methacrylic acid with monohydric or polyhydric alcohols of 2 to 20 carbon atoms, e.g. butyl acrylate, butyl methacrylate, 2-ethylhexyl acrylate, lauryl (meth)acrylate, ethylene glycol di(meth)acrylate, butanediol 1,4-di(meth)acrylate, neopentylglycol di(meth)acrylate, 3-methylpentanediol di(meth)acrylate, 2-hydroxypropyl (meth)acrylate, 2-hydroxyethyl (meth)acrylate, hexanediol 1,6-di(meth)acrylate, 1,1,1-trimethylolpropane tri(meth)acrylate, di-, tri- and tetraethyleneglycol di(meth)acrylate, tripropylene glycol di(meth)acrylate or pentaerythritol tetra(meth)acrylate. The vinyl esters of aliphatic monocarboxylic acids, e.g. vinyl oleate, the vinyl ethers of alcohols, e.g. octadecyl vinyl ether and butane-1,4-diol divinyl ether, the diesters of fumaric and maleic acid and the reaction products of oligobutadienes, having OH terminal groups, with maleic acid and/or (meth)acrylic acid are also suitable. In the novel mixtures, they are used, preferably individually or as a mixture, in an amount of from 1 to 40, advantageously from 2 to 30, in particular from 3 to 20, % by weight, based on a novel mixture of binder, monomer, initiator and inhibitor.

Examples of suitable compatible photoinitiators are benzoin and benzoin derivatives, such as its methyl, isopropyl, n-butyl or isobutyl ether, symmetrically or asymmetrically substituted benzil acetals, such as benzil dimethyl acetal or benzil 1-methyl 1-ethyl acetal, acyldiarylphosphine oxides and acylarylphosphinic acid derivatives, such as 2,6-dimethoxybenzoyl diphenyl phosphine oxide, 2,4,6-trimethylbenzoyl diphenylphosphine oxide, sodium 2,4,6-trimethylbenzoylphenylphosphinate or ethyl 2,4,6-trimethylbenzoylphenylphosphinate, and substituted or unsubstituted quinones, such as ethylanthraquinone, benzanthraquinone, benzophenone or 4,4'-bis-(dimethylamino)-benzophenone. They can be used individually or as a mixture with one another. They are preferably used in the novel mixtures in an amount of from 0.01 to 10, advantageously from 0.1 to 8, in particular from 0.5 to 5, % by weight, based on a novel mixture of binder, monomer, initiator and inhibitor, the amount also being determined by the amount of photopolymerizable monomers present.

Suitable thermal polymerization inhibitors themselves generally have no significant absorption in the actinic range in which the photoinitiator absorbs. Examples of suitable inhibitors are hydroquinone, p-methoxyphenol, 2,6-di-tert-butyl-p-cresol, $\beta$-naphthol, phenothiazine, nitrobenzene, m-dinitrobenzene or chloranil, thiazine dyes, such as thionine blue G (C.I. 52,025), methylene blue B (C.I. 52,015) or toluidine blue (C.I. 52,040), N-nitrosamines, such as N-nitrosodiphenylamine, and the salts, for example the potassium, calcium, cerium or aluminum salts, of N-nitrosocyclohexylhydroxylamine. They are preferably used in amounts of from 0.001 to 2, preferably from 0.01 to 1.8, in particular from 0.1 to 1.5, % by weight, based on a novel mixture of binder, monomer, initiator and inhibitor.

The mixtures according to the invention may also contain further additives.

These include, for example, plasticizers, antiozonants, dyes, pigments, photochromic additives, reducing agents, agents for improving the relief structure antioxidants, fillers, reinforcing fillers, fluxes, mold release agents, crosslinking assistants, tackifying resins and rubbers, which may be added alone or as a mixture, in amounts of up to 100 parts by weight per 100 parts by weight of the novel mixture.

The preparation of the novel mixtures from the components does not have any special features with regard to the method used; for example, the conventional kneading, mixing and dissolving techniques may be employed.

The novel mixtures thus obtained can be used directly as photocurable adhesives, sealing materials or surface coatings, or can be further processed to give photocrosslinkable films, printing plates or relief plates. To do this, they are shaped to sheet-like structures of the desired thickness in a conventional manner, for example by casting from a solution, hot-pressing, calendering or extrusion. In the case of the plates, the thickness depends primarily on the subsequent use and varies in general from 0.01 to 7 mm, in particular from 0.025 to 6.5 mm, since, for example, printing forms produced therefrom and having this thickness are suitable for the majority of printing techniques. Films may be of any thickness.

The sheet-like structures can be processed as such to give printing forms, relief forms or photocrosslinked films; however, it is usual to laminate them with other layer-like materials before processing them further. A laminate of this type is generally referred to as a multilayer element, and the sheet-like structure present therein is referred to as the relief-forming layer RL in the case of printing plates and relief plates, and as the photocrosslinkable film PF in other cases.

In a multilayer element of this type, RL or PF is usually firmly bonded to a dimensionally stable base B. B in turn may possess a resilient and flexible lower layer underneath. Furthermore, a covering layer CL and/or a cover sheet CS may be applied to that side of RL or of PF which faces away from B. If CL and CS are used together, CL is directly on top of RL, and an antiadhesion layer AL may furthermore be present between CL and CS. Furthermore, a firm bond between B and RL or PF and, if necessary, between RL or PF and CS can be obtained with the aid of an adhesion-promoting layer AP.

In general, sheets, films or sleeves of metals such as steel, aluminum, copper or nickel or of plastics such as polyethylene terephthalate, polybutyleneterephthalate, nylon or polycarbonate can be used as B. Woven and nonwoven fabrics, e.g. glass fiber fabrics or composites of, for example, glass fibers and plastics such as polyethylene terephthalate, are also suitable.

In general, about 0.5–40 $\mu$m thick adhesionpromoting layers of conventional reaction adhesives based on polyurethane, polychloroprene or phenoxy resin/polycarbonate can be used as AP.

In general, about 0.5–20 $\mu$m thick layers of a polymer which forms soluble, non-tacky, transparent films having a high tensile strength can be used as CL. For example, nylon, nylon copolymers, polyurethane, polyvinyl alcohol, polyvinylpyrrolidone, polyethylene oxide and cyclized rubbers having a high degree of cyclization are suitable. CL can, if required, be matted.

In general, about 20–150 $\mu$m thick layers of a polymer, such as nylon or polyethylene terephthalate, can be used as CS.

In general, about 0.1 to 0.5 $\mu$m thick layers of, for example, silicone resins can be employed as AL.

If sheets or films having a high reflectivity are used as B, they may contain suitable antihalation agents, i.e. substances having a high extinction coefficient, such as carbon black, manganese dioxide or auramine dyes, which may be present as a mixture with benzophenone derivatives. However, the antihalation agents may also be applied as a separate layer on B or may be present in AP or RL.

The method for the production of such multilayer elements has no special features, and the said elements can be produced by applying RL or PF onto B, for example by casting from solution, hot-pressing, calendering or extrusion. The other layers can then be applied onto this two-layer element in a conventional manner. However, it is also possible first to apply RL or PF onto that side of CS which is covered with CL and then to bond the uncovered side of RL firmly to B.

The sheet-like structures consisting of the novel mixtures, or the multilayer elements containing such sheet-like structures obtained from the novel mixtures, can be converted to photocrosslinked films by uniform exposure and to printing forms and relief forms by imagewise exposure. Neither of these procedures has any special features with regard to the method used. In both cases, exposure can be effected using actinic light having a wavelength $\lambda$ of from 230 to 450 nm, advantageously from 300 to 450 nm. Imagewise exposure is followed by washing out of the unexposed and therefore non-crosslinked parts of the sheet-like structures (development), drying of the resulting printing forms and relief forms and, if required, their after-treatment.

Examples of suitable sources of actinic light are sunlight, commercial UV fluorescent tubes, medium pressure, high pressure and low pressure mercury lamps, superactinic fluorescent tubes, pulsed xenon lamps, lamps doped with metal iodides and carbon arc lamps.

Suitable developers are aromatic hydrocarbons, e.g. toluene or ethylbenzene, chlorohydrocarbons, e.g. 1,1,1-trichloroethane, 1,1,2,2-tetrachloroethane or tetrachloroethylene, ketones, e.g. methyl isobutyl ketone, and mixtures of such solvents with one another and with lower alcohols, e.g. n-butanol.

Depending on the intended use, the thickness of RL in the printing forms and relief forms varies from 0.01 to 7 mm, thicknesses of from 0.025 to 6.5 mm being advantageous.

The printing forms obtained in this manner and based on the novel mixtures can be mounted on printing cylinders, if necessary roughened by corona discharge, and used for continuous printing.

In the Examples which follow, the Shore A hardness was determined according to DIN 53,505, the resilience according to DIN 53,512, the elongation at break according to DIN 53,504 on test specimens S2, the deformation hardness and the deformation resilience according to DIN 53,514 and the viscosity number VN according to DIN 51,562 on polymer solutions of 0.5 g of I in 120 ml of toluene. The molecular weight was determined by gel permeation chromatography, polystyrenes having different molecular weights being used as calibration substances.

Initially, polymers I according to patent application P 35 25 798.9 were prepared for the examples. Table 1 gives an overview of their composition, while Table 2 summarizes their performance characteristics.

TABLE 1

Polymers I

| Pol | Composition | I-1 | I-2 | I-3 | I-4 | I-5 | I-6 | I-7 | I-8 | I-9 | I-10 | I-11 |
|---|---|---|---|---|---|---|---|---|---|---|---|---|
| | Block A: | | | | | | | | | | | |
| | % by weight of styrene[a] | 13 | 13 | 17 | 17 | 22 | 22 | 17 | 17 | 17 | 17 | 17 |
| | Block B: | | | | | | | | | | | |
| | % by weight of butadiene[a] | 87 | 87 | 83 | 83 | 78 | 78 | 83 | 83 | 83 | — | — |
| | % by weight of isoprene[a] | — | — | — | — | — | — | — | — | — | 83 | 83 |
| | $R^1$ | —CH$_2$—CH$_2$— | s.p. | s.p. | s.p. | s.p. | s.p. | s.p. | s.p. | s.p. | —CH$_2$—CH— $\|$ CH$_3$ | —CH$_2$—CH$_2$— |
| | a | 1 | s.p. | s.p. | s.p. | s.p. | s.p. | s.p. | s.p. | s.p. | s.p. | s.p. |
| | $R^2$ | —CH=CH— | s.p. | s.p. | s.p. | s.p. | s.p. | s.p. | —CH$_2$—CH$_2$— | —CH=CH— | s.p. | s.p. |
| | $X^\ominus$ | —COO$^\ominus$ | s.p. | s.p. | s.p. | s.p. | s.p. | s.p. | s.p. | s.p. | s.p. | s.p. |
| | M | Li$^\oplus$ | s.p. | s.p. | s.p. | s.p. | s.p. | Zn$^{2\oplus}$ | Al$^{3\oplus}$ | Li$^\oplus$ | s.p. | s.p. |
| | n | 1 | s.p. | s.p. | s.p. | s.p. | s.p. | 2 | 3 | 1 | s.p. | s.p. |

[a] A + B = 100% by weight
s.p. = see previous example

TABLE 2

Performance characteristics of the polymers I

| Property | I-1 | I-2 | I-3 | I-4 | I-5 | I-6 | I-7 | I-8 | I-9 | I-10 | I-11 |
|---|---|---|---|---|---|---|---|---|---|---|---|
| Molecular weight | 70.000 | 80.000 | 40.000 | 60.000 | 45.000 | 10.000 | 60.000 | 60.000 | 85.000 | 60.000 | 60.000 |
| Viscosity number VN (ml/g) | 147 | 163 | 114 | 161 | 100 | 40 | 113 | 209 | 188 | 80 | 115 |
| Deformation hardness | 2750 | 4750 | 2650 | 4700 | 5200 | | 8000 | >20000 | 5750 | 4000 | 5100 |
| Deformation resilience | 32 | 41 | 30 | 42 | 34 | | 45 | | 43 | 55 | 41 |
| Shore A hardness | 18 | 25 | 18 | 25 | 28 | 19 | 39 | 59 | 28 | 22 | 25 | lq. = liquid

EXAMPLE 1

Preparation of a mixture which can be crosslinked by photopolymerization, and of photocrosslinked films of the said mixture.

246.80 g of polymer I-1 according to Table 1, 18.70 g of hexane-1,6-diol diacrylate, 9.20 g of hexane-1,6-diol dimethacrylate, 3.35 g of benzil dimethyl acetal and 1.39 g of 2,6-di-tert-butyl-p-cresol were dissolved in 370 g of toluene at 65° C. Some of the solution was applied, by knife coating, onto a 125 μm thick polyester sheet coated with a 2 μm thick nylon film (nylon copolymer of dimeric alkane dicarboxylic acids having a molecular weight of 565 and hexamethylenediamine), the thickness of the cast layer being adjusted with the aid of a knife coater so that, after the toluene had been evaporated off at 80° C., a photocrosslinkable film about 0.7 mm thick remained. This film was covered with a transparent 25 μm thick polyethylene sheet and exposed uniformly for 15 minutes from the front and back using a flat-plate exposure unit equipped with 40 watt UV tubes. The temporary base and cover sheet were removed to give a self-supporting photocrosslinked film which had a tensile strength of 11.1 N/mm² and an elongation at break of 264%, 4.6 N/mm² being required for 100% elongation. The increase in weight due to swelling after 24 hours at 25° C. was 0.9% in ethanol, 0.1% in water and 13% in ethanol/ethyl acetate (weight ratio 7:3). Its recovery behavior was very good: the indentation produced by a cylindrical punch of 4 mm diameter by applying a load of 1000 g for 2 minutes decreases to 1.4% after relaxation for a further 2 minutes.

The original photocrosslinkable film showed only a very small tendency to creep under load.

Another part of the casting solution was poured into frames so that, after the toluene had been evaporated off and drying had been carried out at 25° C. for 7 days, at 80° C. for 3 hours and at 50° C. for 24 hours, 6 mm thick photocrosslinkable films were obtained. These were covered on each side with a transparent film and exposed uniformly for 15 minutes on both sides. The resulting photocrosslinked films had a Shore A hardness of 55 and a resilience of 67%.

EXAMPLES 2 to 6

Preparation of mixtures which are crosslinkable by photopolymerization, and of photocrosslinked films of the mixtures.

In Examples 2 to 6, the formulation stated in Example 1 was used, except that, instead of the polymer I-1 according to Table 1, other polymers I were used. The preparation of the mixtures, the films and the sheets, and the test procedure, were carried out as described in Example 1. Table 3 gives an overview of the test results. For the sake of clarity, the test results from Example 1 are also included.

TABLE 3

Examples 2 to 6

| Test Results Example No. | 1 | 2 | 3 | 4 | 5 | 6 |
|---|---|---|---|---|---|---|
| Polymer according to Table 1 | I-1 | I-2 | I-4 | I-5 | I-8 | I-11 |
| Thin sheet: | | | | | | |
| Thickness (mm) | 0.7 | 0.7 | 0.7 | 0.7 | 0.7 | 0.7 |
| Tensile strength (N/mm²) at | 11.1 | | 7.5 | 9.1 | 7.0 | 9.2 |
| Elongation at break (%) | 264 | | 267 | 303 | 243 | 42 |
| 100% elongation at (N/mm²) | 4.6 | | 2.6 | 3.5 | 3.4 | 1.1 |
| Increase in weight due to swelling (24 h, 25° C.): | | | | | | |
| in ethanol (% by weight) | 0.9 | 2.2 | | 2.1 | 2.9 | 2.2 |
| in H₂O (% by weight) | 0.1 | 0.7 | | — | — | 0.9 |
| in ethanol/ethyl acetate (% by weight) | 13 | 14 | | 15.3 | 16.8 | 14.0 |
| Punch impression: | | | | | | |
| residual deformation (%) | 1.4 | 1.4 | 0.6 | 0.7 | 0.5 | 0.6 |
| Thick sheet: | | | | | | |
| Thickness (mm) | 6 | 6 | 5 | 5 | 5 | 5 |
| Resilience (%) | 67 | 74 | 66 | 54 | 59 | 46 |
| Shore A hardness | 55 | — | 65 | 68 | 74 | 46 |
| Tendency of the photocrosslinkable films to creep under load | very little | very little | very little | very little | very little | very little |

EXAMPLE 7

Preparation of a mixture which can be crosslinked by photopolymerization, and of photocrosslinked films of this mixture.

A casting solution was prepared from 156.60 g of polymer I-3 according to Table 1, 13.40 g of hexane-1,6-diol diacrylate, 6.60 g of hexane-1,6-diol dimethacrylate, 2.40 g of benzil dimethyl acetal, 1.00 g of 2,6-di-tert-butyl-p-cresol, 12 mg of Sudan deep black (C.I.

26,150), 10.00 g of liquid paraffin (medicinal white oil, aromatics-free, viscosity (25° C.)=140 mPa.s, pour point = −9° C., density (15° C.)=0.865 g/cm³), 10.00 g of a p-methylstyrene-α-methylstyrene copolymer (softening point =95°–110° C., refractive index (25° C.)=1.58, melt viscosity (130° C.)=1 Pas) and 200 g of toluene, and a 5.7 mm thick photocrosslinked sheet was prepared from this casting solution as described in Example 1, in a casting frame. The said photocrosslinked sheet had a Shore A hardness of 55 and a resilience of 62%. Furthermore, the mixture was converted to a 0.7 mm thick sheet according to Example 1, and the residual deformation of this sheet was measured as described in Example 1. It was found to be 1.4%.

EXAMPLE 8

Preparation of a mixture which can be crosslinked by photopolymerization, and of photocrosslinked films of this mixture.

A mixture was prepared by extruding 25.00 kg of granulated polymer I-4 according to Table 1, 1.50 kg of liquid paraffin according to Example 7, 1.01 kg of hexane-1,6-diol diacrylate, 0.49 kg of hexane-1,6-diol dimethacrylate, 1.50 kg of p-methylstyrene/α-methylstyrene copolymer according to Example 7, 0.36 kg of benzil dimethyl acetal, 0.15 kg of 2,6-di-tert-butyl-p-cresol and 1.8 kg of Sudan deep black (C.I. 26,150) in a twin-screw extruder. To do this, the liquid components (liquid paraffin and monomers) were mixed with the dye, the stabilizer and the photoinitiator, injected into the mixing extruder and mixed at 136° C. with the thermoplastic components, and the resulting mixture was extruded at 150° C. via a slot die. With the aid of calender, the extruded mixture was applied with one side on a 125 μm thick polyethylene terephthalate film covered with a 5 μm thick phenoxy resin/polycarbonate adhesion-promoting layer, and was covered on the other side with a nylon-coated polyethylene terephthalate film according to Example 1, and the multilayer element was brought to a total thickness of 3.01 mm.

Some of the extruded mixture was discharged without calendering and used to produce 0.7 mm and 5.7 mm thick sheets according to Example 1. The thick sheet had a Shore A hardness of 55 and a resilience of 62%, while the thin sheet had a residual deformation of 1.4% after the punch indentation test according to Example 1.

EXAMPLE 9

Preparation of a mixture which can be crosslinked by photopolymerization, and of photocrosslinked films of this mixture.

The procedure described in Example 8 was followed, except that polymer I-7 was used instead of polymer I-4. The photocrosslinkable film had an extremely small tendency to creep.

A 5.7 mm thick photocrosslinked sheet prepared from the mixture as described in Example 1 had a Shore A hardness of 59 and a resilience of 61%.

EXAMPLE 10

Preparation of a mixture which can be crosslinked by photopolymerization, and of photocrosslinked films of this mixture.

A mixture as described in Example 8, in which polymer I-8 was used instead of polymer I-4, was converted to a casting solution in toluene as described in Example 1 and processed in a similar manner to give 5 mm thick photocrosslinked sheets.

The Shore A hardness of the 5 mm thick sheet was 74 and its resilience was 59%. According to the punch indentation test described in Example 1, the residual deformation was 0.5%.

EXAMPLE 11

Preparation of a liquid mixture which can be crosslinked by photopolymerization, and its use as a coating film.

156.00 g of polymer I-6 according to Table 1, 30.00 g of hexane-1,6-diol dimethacrylate, 1.00 g of 2,6-di-tert-butyl-p-cresol and 2.40 g of benzil dimethyl acetal were mixed with one another at 60° C. to give a homogenous mixture. Samples were taken and cast on glass, metal and plastic sheets. The resulting coating films were covered with polyethylene sheets and exposed uniformly for 30 minutes through the cover sheets. After the latter had been peeled off, transparent coating films having a Shore A hardness of 25 were obtained.

EXAMPLE 12

Preparation of a mixture which can be crosslinked by photopolymerization, and its use as a photocurable adhesive.

100 g of polymer I-4 according to Table 1, 80 g of a piperylene/2-methylbut-2-ene copolymer (Wingtack 95$^R$ from Goodyear), 20 g of 1,1,1-trimethylolpropane trimethacrylate, 1.5 g of 2,6-di-tert-butyl-p-cresol and 3 g of benzil dimethyl acetal were dissolved in 160 g of cyclohexane at 60° C. A sample of this solution was used to coat a polyethylene terephthalate film, and the solvent was evaporated at 50° C. The resulting dry, photocurable adhesive layer was laminated with a further polyethylene terephthalate film and exposed uniformly for 2 minutes. The adhesion of the photocured adhesive to the two films was excellent, and they could no longer be separated from one another without damaging the entire laminate.

EXAMPLES 13 and 14

Preparation of mixtures which can be crosslinked by photopolymerization, and the ozone stability of the photocrosslinked films prepared from these.

Webs of 2.84 mm thick multilayer elements were extruded and calendered as described in Example 8, except that nylon-coated polyethylene terephthalate bases as described in Example 1 were used instead of the polyethylene terephthalate bases provided with an adhesion-promoting layer. In Example 14, polymer I-10 according to Table 1 was used instead of polymer I-4.

Samples were removed from the film webs and exposed uniformly on both sides for 15 minutes in each case. After the cover sheets and temporary bases had been peeled off, the mechanical properties were determined; a summary is given in Table 4.

TABLE 4

| Mechanical properties of photocrosslinked films | | |
|---|---|---|
| Example No. | 13 | 14 |
| Shore A hardness | 55 | 44 |
| Resilience (%) | 62 | 61 |
| Punch indentation test according to Example 1: | | |
| Residual deformation (%) | 1.4 | 8 |

The stability to ozone was tested as follows: 2 cm wide test strips of the webs were each exposed on one side for 10 minutes, treated with a mixture of tetrachloroethylene and n-butanol (volume ratio=4:1) for 6 minutes, dried at 80° C. for 1 hour, stored at room temperature for 15 hours, after-treated with a 0.4% strength aqueous bromine solution for 5 minutes and postexposed for 10 minutes. The resulting pieces of film could accordingly be regarded as models for flexographic printing forms.

The pieces of film were exposed at 24° C. to air having an ozone content of 50 pphm, in an ozone chamber. In the case of the pieces of film according to Example 13, the first ozone cracks were observed after 150 minutes; in the case of those according to Example 14, the said cracks were observed after 30 minutes. Accordingly, only pieces of film according to Example 13 exhibited satisfactory ozone stability in the absence of antiozonants.

EXAMPLE 15

Preparation of a mixture which can be crosslinked by photopolymerization, and of printing forms based on this mixture.

A 0.7 mm thick relief-forming layer RL was produced on a nylon-coated polyethylene terephthalate film from a mixture according to Example 1, which additionally contained 2.4 mg of Sudan deep black (C.I. 26,150), the said layer RL being produced as described in Example 1. The free surface of RL in this multilayer element was laminated, with the aid of a laminating roll, with a 125 μm thick polyester film coated with a phenoxy resin/polycarbonate adhesion-promoting layer. The mixture of adhesive-forming components contained, as an antihalation agent, a mixture of a yellow auramine dye (auramine FA, Basic Yellow 2, C.I. 41,000) and 4,4'-bis-(N-β-hydroxyethyl-N-methylamino)-benzophenone in a weight ratio of 4:1, having an extinction of 0.40 at a wavelength λ of 360 nm. After the lamination procedure, the original base was peeled off, the nylon layer remaining on RL. A photographic test negative was placed on the nylon-coated side of RL, and RL was exposed imagewise for 10 minutes with the aid of a flat-plate exposure unit. Thereafter, the exposed multilayer element was developed in a brush washer with a mixture of 3 parts by volume of tetrachloroethylene and 1 part by volume of n-butanol, after-treated with a 0.4% strength bromine solution for 3 minutes, dried, and postexposed uniformly for 10 minutes. A flexographic printing form which had a well defined relief having crisp edges and good shadow well depths in the continuous tone areas was obtained. Excellent print results were obtained when printing was carried out on a flexographic printing press using an ethanol-based ink. The printing form showed no abrasion, cracks or deformation, even after several hours' printing.

EXAMPLE 16

Preparation of a mixture which can be crosslinked by photopolymerization, and of printing plates based on this mixture.

A multilayer element consisting of a 125 μm thick polyethylene terephthalate sheet, a 2 μm thick nylon intermediate layer and a 0.7 mm thick relief-forming layer RL was produced, as described in Example 1, with the aid of the casting solution according to Example 7, and was kept for further use.

A 75 μm thick polyethylene terephthalate sheet was coated on both sides with a 5 μm thick phenoxy resin/polycarbonate adhesion-promoting layer and kept for further use. The adhesion-promoting layer which subsequently faces RL contained an antihalation agent according to Example 15.

To produce a base according to German Laid-Open Application DOS 2,444,118, 196.00 g of polymer I-9 according to Table 1, 75.00 g of a liquid polybutadiene having a molecular weight of 1300, a viscosity (25° C.) of 7 Pas and a density of 0.89 g/cm³ and containing about 40% by weight of 1,2 structural units, 3.60 g of benzil dimethyl acetal, 24.00 g of hexane-1,6-diol dimethacrylate and 1.50 g of 2,6-di-tert-butyl-p-cresol were dissolved in 250 g of toluene, and the solution was cast, as described in Example 1, on a nylon-coated polyethylene terephthalate sheet in such a way that a 1.00 mm thick photocrosslinkable film remained after drying. (A sample of this multilayer element was exposed uniformly; the photocrosslinked film had a Shore A hardness of 39 and a resilience of 60%). The polyethylene terephthalate sheet coated with an adhesion-promoting layer was laminated with the free surface of this film in a calender, the adhesion-promoting layer which did not contain any antihalation agent being bonded to the film. The resulting multilayer element was exposed uniformly on both sides for 15 minutes using 40 watt UV tubes, after which the free adhesion-promoting layer of the exposed multilayer element was bonded, by lamination, to the free surface of RL in the initially produced multilayer element.

This multilayer element was exposed uniformly for 12 minutes through the base. Thereafter, the upper polyethylene terephthalate sheet was peeled off from RL and the latter was exposed imagewise through a photographic test negative placed on top and was developed, these tests being carried out as described in Example 15. Print tests with this printing form on a flexographic printing press gave a print run of more than 100,000 coupled with very good image reproduction.

EXAMPLE 17

Preparation of a mixture which can be crosslinked by photopolymerization and of printing forms based on this mixture.

The 3.01 mm thick multilayer element produced as described in Example 8 was cut to size to give flexographic printing plates of commercial size (0.6×0.32 m). A flexographic printing plate of this type was preexposed uniformly for 1 minute through the base, after which the cover sheet was peeled off, the nylon layer remaining on RL. RL was exposed for 14 minutes through a photographic test negative placed on the nylon layer, and was developed as described in Example 15 in a brush washer, and the resulting flexographic printing form was dried for 1 hour at 80° C. and stored at room temperature for 15 hours. The printing form was then brominated for 3 minutes in a conventional manner, dried again and postexposed uniformly for 10 minutes.

The flexographic printing form produced in this manner, or its relief layer, possessed a relief depth of 800 μm and had a very good side wall structure and very crisp edges. Print tests with this printing form on a flexographic printing press gave print results showing very exact image reproduction.

We claim:

1. A light sensitive recording element comprising
a dimensionally stable support layer and
a photopolymerizable recording layer having a thickness of 0.01 to 7 mm, said photopolymerizable recording layer consisting essentially of
(i) from 40 to 99% by weight, based on the photopolymerizable recording layer, of one or more polymers of the formula I as binders

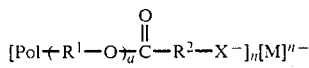   I where
Pol is a radical of a block copolymer prepared by sequential anionic polymerization of conjugated dienes and vinylaromatics,
$R^1$ is a vicinal alkanediyl group,
$R^2$ is a divalent hydrocarbon group of 2 to 20 carbon atoms,
$X^-$ is an acid anion,
M is a metal cation, a metal cation complex or a cation of an amine, and
a and n are each an integer from 1 to 10,
(ii) one or more ethylenically unsaturated photopholymerizable monomers which are compatible with said polymers of the formula I, and
(iii) one or more photoinitiators.

2. The light sensitive recording element of claim 1, wherein $R^2$ is ethylene, trimethylene, propene-2,3-diyl, buta-1,3-diene-2,3-diyl, cyclohex-1,2-ylene, cyclohex-3-en-1,6-ylene, cyclopent-1,2-ylene, o-phenylene or napthalene-1,8-diyl.

3. The light sensitive recording element of claim 1, wherein the photopolymerizable recording layer consists essentially of from 40 to 99% by weight, based on the photopolymerizable recording layer, of one or more polymers of the formula I, from 1 to 40% by weight, based on the photopolymerizable recording layer, of one or more ethylenically unsaturated photopolymerizable monomers which are compatible with said polymers of the formula I, and one or more photoinitiators.

4. The light sensitive recording element of claim 1, wherein the photopolymerizable recording layer consists essentially of from 40 to 99% by weight, based on the photopolymerizable recording layer, of one or more polymers of the formula I, from 1 to 40% by weight, based on the photopolymerizable recording layer, of one or more ethylenically unsaturated photopolymerizable monomers which are compatible with said polymers of the formula I, from 0.001 to 10% by weight, based on the photopolymerizable recording layer, of one or more photoinitiators, and from 0.001 to 2% by weight, based on the photopolymerizable recording layer, of one or more thermal polymerization inhibitors.

* * * * *